US012813086B2

(12) United States Patent
Moon

(10) Patent No.: US 12,813,086 B2
(45) Date of Patent: Nov. 24, 2026

(54) LIGHT EMITTING DISPLAY DEVICE

(71) Applicant: LG Display Co., Ltd., Seoul (KR)

(72) Inventor: Ji Su Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 424 days.

(21) Appl. No.: 18/474,066

(22) Filed: Sep. 25, 2023

(65) Prior Publication Data

US 2024/0215328 A1 Jun. 27, 2024

(30) Foreign Application Priority Data

Dec. 22, 2022 (KR) ........................ 10-2022-0182049

(51) Int. Cl.

| | |
|---|---|
| ***H10K 50/00*** | (2023.01) |
| ***H10K 50/19*** | (2023.01) |
| ***H10K 59/122*** | (2023.01) |
| ***H10K 59/32*** | (2023.01) |
| ***H10K 59/50*** | (2023.01) |
| ***H10K 59/80*** | (2023.01) |
| *H10K 102/00* | (2023.01) |

(52) U.S. Cl.

CPC ........... *H10K 59/122* (2023.02); *H10K 59/32* (2023.02); *H10K 59/875* (2023.02); *H10K 2102/351* (2023.02)

(58) Field of Classification Search

CPC ........ H10K 59/50; H10K 59/19; H10K 59/35; H10K 59/122; H10K 59/32

See application file for complete search history.

(56) References Cited

U.S. PATENT DOCUMENTS

| | | | |
|---|---|---|---|
| 9,831,454 | B2 | 11/2017 | Park |
| 10,243,158 | B2 | 3/2019 | Park |
| 10,879,481 | B2 | 12/2020 | Park |

(Continued)

FOREIGN PATENT DOCUMENTS

| | | | |
|---|---|---|---|
| KR | 10-2017-0030364 | A | 3/2017 |
| KR | 10-2018-0025057 | A | 3/2018 |

(Continued)

OTHER PUBLICATIONS

Ministry of Intellectual Property of Korea, Office Action, Korean Patent Application No. 10-2022-0182049, Mar. 24, 2026, 15 pages.

*Primary Examiner* — Joseph L Williams
(74) *Attorney, Agent, or Firm* — Fenwick & West LLP

(57) ABSTRACT

In a light emitting display device according to an embodiment of the present disclosure, lateral leakage current caused by a layer having high mobility in the device is prevented by changing an internal structure of a stack of light emitting elements. The light emitting display device of the disclosure includes a bank to expose a plurality of light emitting portions spaced apart from each other on a substrate, a first electrode at each of the plurality of light emitting portions and a second electrode to face the first electrode, a first stack, a second stack and a charge generation layer between the first electrode and the second electrode, and an optical compensation layer located between the charge generation layer and the first stack and in contact with the charge generation layer at at least one of the plurality of light emitting portions.

20 Claims, 14 Drawing Sheets

(56) References Cited

U.S. PATENT DOCUMENTS

| | | | | |
|---|---|---|---|---|
| 11,770,944 | B2 * | 9/2023 | Jeon | H10K 59/32 257/40 |
| 2017/0069865 | A1 | 3/2017 | Park | |
| 2017/0250234 | A1 | 8/2017 | He et al. | |
| 2018/0019429 | A1 | 1/2018 | Park | |
| 2019/0173035 | A1 | 6/2019 | Park | |
| 2022/0209172 | A1 | 6/2022 | Jeon | |
| 2023/0255078 | A1 * | 8/2023 | Song | C07D 209/08 257/40 |
| 2024/0065020 | A1 * | 2/2024 | Kim | H10K 50/181 |

FOREIGN PATENT DOCUMENTS

| | | | | |
|---|---|---|---|---|
| KR | 10-2022-0092163 | A | 7/2022 | |
| WO | WO-2022145678 | A1 * | 7/2022 | H10K 59/876 |

* cited by examiner

LIGHT EMITTING DISPLAY DEVICE

CROSS-REFERENCE TO RELATED APPLICATIONS

This application claims the benefit of Republic of Korea Patent Application No. 10-2022-0182049, filed on Dec. 22, 2022, which is hereby incorporated by reference as if fully set forth herein.

BACKGROUND

Field

The present disclosure relates to a display device and relates to a light emitting display device capable of reducing or preventing leakage current between adjacent light emitting portions by changing an internal structure of a light emitting element.

Discussion of the Related Art

As the information age is entered, a display field in which electrical information signals are visually expressed has rapidly developed. In response thereto, various thin and light display devices having excellent performance and low power consumption have been developed.

Among these display devices, a light emitting display device, which does not require a separate light source, does not include a separate light source for compactness of the device and vivid color display and has a light emitting element in a display panel, has been considered as a competitive application.

The light emitting element may include an anode and a cathode facing each other as electrodes, include a light emitting layer between the anode and the cathode, and may include a common layer that transfers holes and electrons to the light emitting layer.

In addition, the light emitting element may be formed in a plurality of stacks to increase efficiency. A charge generation layer may be included for connection between the plurality of stacks.

SUMMARY

Accordingly, the present disclosure is directed to a light emitting display device that substantially obviates one or more problems due to limitations and disadvantages of the related art.

To connect the plurality of stacks in the light emitting display device, the charge generation layer includes a dopant having high mobility, and thus current may flow not only in a vertical direction but also in a horizontal direction. Therefore, lateral leakage current may be generated between adjacent light emitting portions.

When lateral leakage current is generated, if a light emitting portion having a high turn-on voltage is driven at low luminance, unintentional lighting may occur in a light emitting portion having a low turn-on voltage, resulting in color mixing at low luminance.

The present disclosure may solve this problem, and in particular, provides a light emitting display device capable of preventing leakage current due to a charge generation layer located between stacks inside a light emitting element.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a light emitting display device may comprise a bank to expose a plurality of light emitting portions spaced apart from each other on a substrate, a first electrode at each of the plurality of light emitting portions and a second electrode to face the first electrode, the second electrode over the plurality of light emitting portions, a first stack, a second stack, and a charge generation layer between the first stack and the second stack, wherein the first stack, the second stack, and the charge generation are positioned between the first electrode and the second electrode and an optical compensation layer located between the charge generation layer and the first stack at at least one of the plurality of light emitting portions and in contact with the charge generation layer.

In addition, in another aspect of the present disclosure, a light emitting display device may comprise a bank to expose a first light emitting portion, a second light emitting portion, and a third light emitting portion spaced apart from each other on a substrate, a first light emitting element at the first light emitting portion to emit blue light, a second light emitting element at the second light emitting portion to emit green light and a third light emitting element at the third light emitting portion to emit red light. A lower surface of a charge generation layer commonly provided in the first to third light emitting portions may be in contact with an electron transport layer at the first light emitting portion, in contact with a first optical compensation layer at the second light emitting portion, and in contact with a second optical compensation layer at the third light emitting portion.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment (s) of the disclosure and together with the description serve to explain the principle of the disclosure.

DETAILED DESCRIPTION

Figure 1:
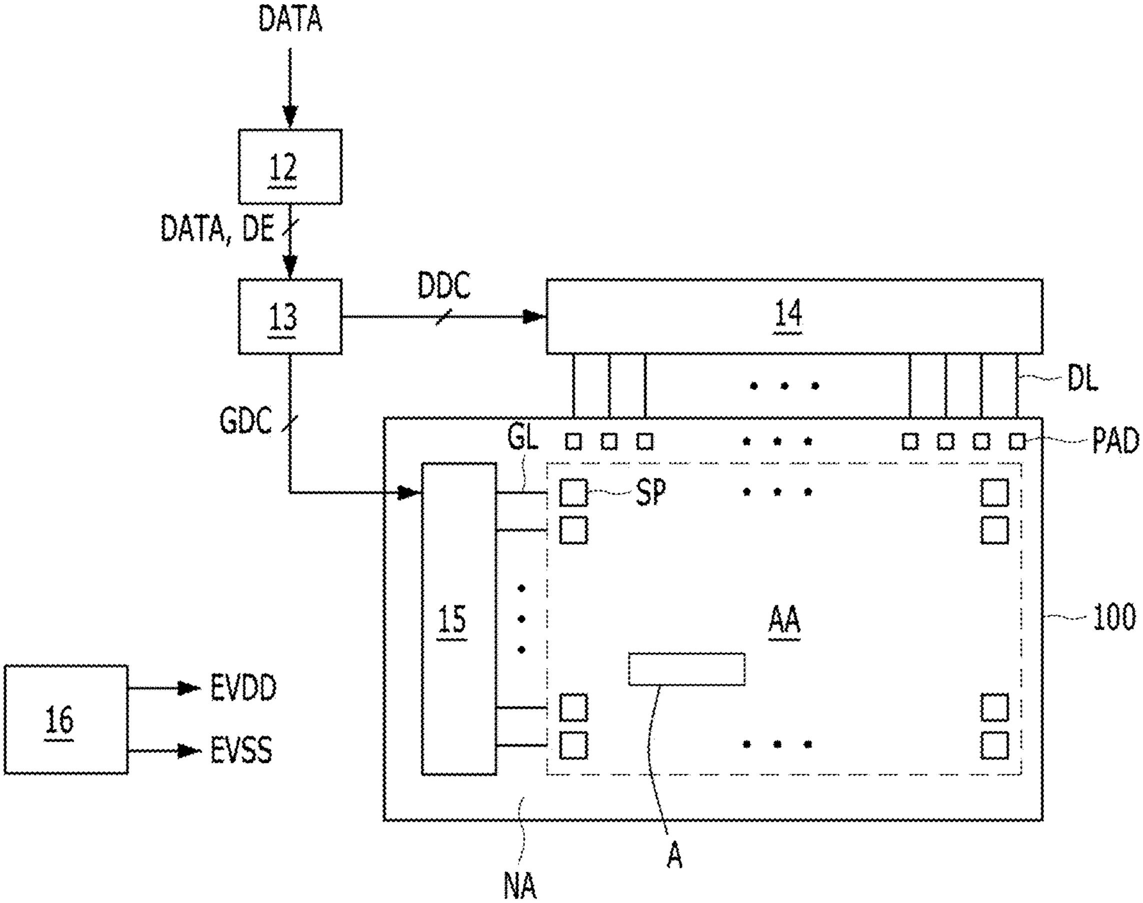
FIG. 1 is a diagram schematically block illustrating a light emitting display device of the present disclosure.

Reference will now be made in detail to the preferred embodiments of the present disclosure, examples of which are illustrated in the accompanying drawings. Wherever possible, the same reference numbers will be used throughout the drawings to refer to the same or like parts. In the following description of the present disclosure, detailed descriptions of known functions and configurations incorporated herein will be omitted when the same may obscure the subject matter of the present disclosure. In addition, the names of elements used in the following description are selected in consideration of clear description of the specification, and may differ from the names of elements of actual products.

The shape, size, ratio, angle, number, and the like shown in the drawings to illustrate various embodiments of the present disclosure are merely provided for illustration, and are not limited to the content shown in the drawings. Wherever possible, the same reference numbers will be used throughout the drawings to refer to the same or like parts. In the following description, detailed descriptions of technologies or configurations related to the present disclosure may be omitted so as unnecessarily obscuring the subject matter of the present disclosure. When terms such as "including", "having", and "comprising" are used throughout the specification, an additional component may be present, unless "only" is used. A component described in a singular form encompasses a plurality thereof unless particularly stated otherwise.

The components included in the embodiments of the present disclosure should be interpreted to include an error range, even if there is no additional particular description thereof.

In describing a variety of embodiments of the present disclosure, when terms for positional relationships such as "on", "above", "under" and "next to" are used, at least one intervening element may be present between two elements, unless "immediately" or "directly" is used.

In describing a variety of embodiments of the present disclosure, when terms related to temporal relationships, such as "after", "subsequently", "next" and "before", are used, the non-continuous case may be included, unless "immediately" or "directly" is used.

In describing a variety of embodiments of the present disclosure, terms such as "first" and "second" may be used to describe a variety of components, but these terms only aim to distinguish the same or similar components from one another. Accordingly, throughout the specification, a "first" component may be the same as a "second" component within the technical concept of the present disclosure, unless specifically mentioned otherwise.

Features of various embodiments of the present disclosure may be partially or completely coupled to or combined with each other, and may be variously inter-operated with each other and driven technically. The embodiments of the present disclosure may be carried out independently from each other, or may be carried out together in an interrelated manner.

As used herein, the term "doped" means that, in a material that occupies most of the weight ratio of a layer, a material (for example, N-type and P-type materials, or organic and inorganic substances) having physical properties different from the material that occupies most of the weight ratio of the layer is added in an amount of less than 30% by weight. In other words, the "doped" layer refers to a layer that is used to distinguish a host material from a dopant material of a certain layer, in consideration of the specific gravity of the weight ratio. Also, the term "undoped" refers to any case other than a "doped" case. For example, when a layer contains a single material or a mixture of materials having the same properties as each other, the layer is included in the "undoped" layer. For example, if at least one of the materials constituting a certain layer is p-type and not all materials constituting the layer are n-type, the layer is included in the "undoped" layer. For example, if at least one of materials constituting a layer is an organic material and not all materials constituting the layer are inorganic materials, the layer is included in the "undoped" layer. For example, when all materials constituting a certain layer are organic materials, at least one of the materials constituting the layer is n-type and the other is p-type, when the n-type material is present in an amount of less than 30 wt %, or when the p-type material is present in an amount of less than 30 wt %, the layer is considered a "doped" layer.

Meanwhile, in this an specification, an electroluminescence (EL) spectrum is calculated via the product of (1) a photoluminescence (PL) spectrum that represents unique properties of an emissive material such as a dopant or host material included in an organic emissive layer and (2) an outcoupling emittance spectrum curve determined depending on the structure and optical properties of an organic light-emitting device including thicknesses of organic layers such as an electron transport layer.

Hereinafter, a light emitting device of the present disclosure and a light emitting display device including the same will be described with reference to the drawings.

FIG. 1 is a block diagram schematically illustrating a light emitting display device of the present disclosure.

As illustrated in FIG. 1, the light emitting display device according to an embodiment of the present disclosure may include a display panel 100, an image processor 12, a timing controller 13, a data driver 14, a scan driver 15, and a power supply 16.

The display panel 100 may display an image in response to a data signal DATA supplied from the data driver 14, a scan signal supplied from the scan driver 15, and power supplied from the power supply 16.

The display panel 100 may include a sub-pixel SP disposed in each intersection area of a plurality of gate lines GL and a plurality of data lines DL. A structure of the sub-pixel SP may be variously changed according to a type of light emitting display device.

For example, sub-pixels SP may be formed using a top emission method, a bottom emission method, or a dual emission method, depending on the structure. The sub-pixels SP refer to units in which a specific type of color filter is formed or no color filter is formed and each includes a light emitting portion to emit light of a color thereof. For example, the sub-pixels SP may include a red sub-pixel, a green sub-pixel, and a blue sub-pixel. Alternatively, the sub-pixels SP may include, for example, a red sub-pixel, a blue sub-pixel, a white sub-pixel, and a green sub-pixel. The sub-pixels SP may have one or more different light emitting areas according to light emitting characteristics. For example, sub-pixels emitting different colors from the color of the blue sub-pixel may have different light emitting areas.

One or more sub-pixels SP may form one unit pixel. For example, one unit pixel may include red, green, and blue sub-pixels, and the red, green, and blue sub-pixels may be repeatedly disposed. Alternatively, one unit pixel may include red, green, blue, and white sub-pixels, and the red, green, blue, and white sub-pixels may be repeatedly disposed, or the red, green, blue, and white sub-pixels may be disposed in a quad type. In an embodiment according to the present disclosure, a color type, arrangement type, and arrangement order of sub-pixels may be set in various forms according to light emitting characteristics, device lifespan, device specifications, etc., and thus the present disclosure is not limited thereto.

The display panel 100 may be divided into an active area AA in which sub-pixels SP are arranged to display an image, and a non-active area NA around the active area AA. The scan driver 15 may be mounted in the non-active area NA of the display panel 100. In addition, the non-active area NA may include a pad PAD including a pad electrode PD.

The display panel 100 includes a substrate (see 110 of FIG. 4), a thin film transistor (see TFT of FIG. 4) on the substrate 110, a light emitting element (see BED, GED, and RED of FIG. 3), and an encapsulation layer (see 300 of FIG. 4) covering the thin film transistor TFT and the light emitting elements BED, GED, and RED.

The image processor 12 may output a data enable signal DE along with the data signal DATA supplied from the outside. The image processor 12 may output one or more of a vertical sync signal, a horizontal sync signal, and a clock signal in addition to the data enable signal DE. However, these signals are omitted for convenience of description.

The timing controller 13 may receive a driving signal and the data signal DATA from the image processor 12. The driving signal may include a data enable signal DE. Alternatively, the driving signal may include a vertical sync signal, a horizontal sync signal, and a clock signal. The timing controller 13 may output a data timing control signal DDC for controlling the operation timing of the data driver 14 and a gate timing control signal GDC for controlling the operation timing of the scan driver 15 based on the driving signal.

In response to the data timing control signal DDC supplied from the timing controller 13, the data driver 14 may sample and latch the data signal DATA supplied from the timing controller 13, convert the signal into a gamma reference voltage, and output the converted voltage.

The data driver 14 may output data signals DATA through the data lines DL. The data driver 14 may be implemented as an integrated circuit IC. For example, the data driver 14 may be electrically connected to the pad electrode PD disposed in the non-active area NA of the display panel 100 through a flexible circuit film (not illustrated).

The scan driver 15 may output a scan signal in response to the gate timing control signal GDC supplied from the timing controller 13. The scan driver 15 may output scan signals through the gate lines GL. The scan driver 15 may be implemented as an integrated circuit IC or implemented in the display panel 100 using a gate-in-panel (GIP) method.

The power supply 16 may output a high-potential voltage and a low-potential voltage for driving the display panel 100. The power supply 16 may supply the high-potential voltage to the display panel 100 through a first power supply line EVDD (a driving power line or a pixel power line), and supply the low-potential voltage to the display panel 100 through a second power line EVSS (an auxiliary power line or a common power line).

The display panel 100 is divided into an active area AA and a non-active area NA, and may include a plurality of sub-pixels SP defined by gate lines GL and data lines DL formed in a matrix by crossing each other on the substrate 110 in the active area AA.

The sub-pixels SP may include sub-pixels that emit light of two or more colors among red light, green light, blue light, yellow light, magenta light, and cyan light. In addition, the plurality of sub-pixels SP may emit colors thereof with or without a specific type of color filter formed therein. However, the present disclosure is not limited thereto, and the color type, arrangement type, and arrangement order of the sub-pixels SP may be set in various forms according to light emitting characteristics, device lifespan, device specifications, etc.

Hereinafter, characteristics of the disclosure will be reviewed through a schematic plan view of the light emitting display device of the present disclosure and a light emitting element structure provided in each light emitting portion.

Figure 2:
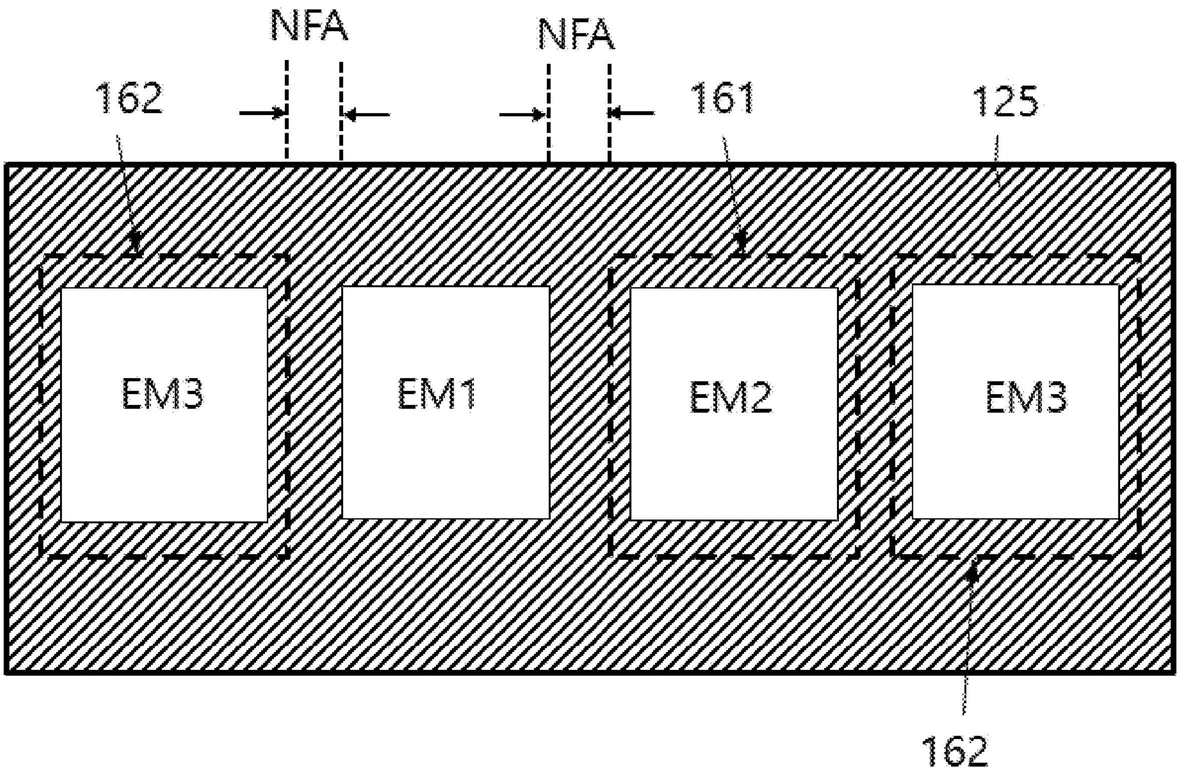
FIG. 2 is an enlarged plan view of area A of FIG. 1 according to an embodiment of the light emitting display device according to the present disclosure.
Figure 3:
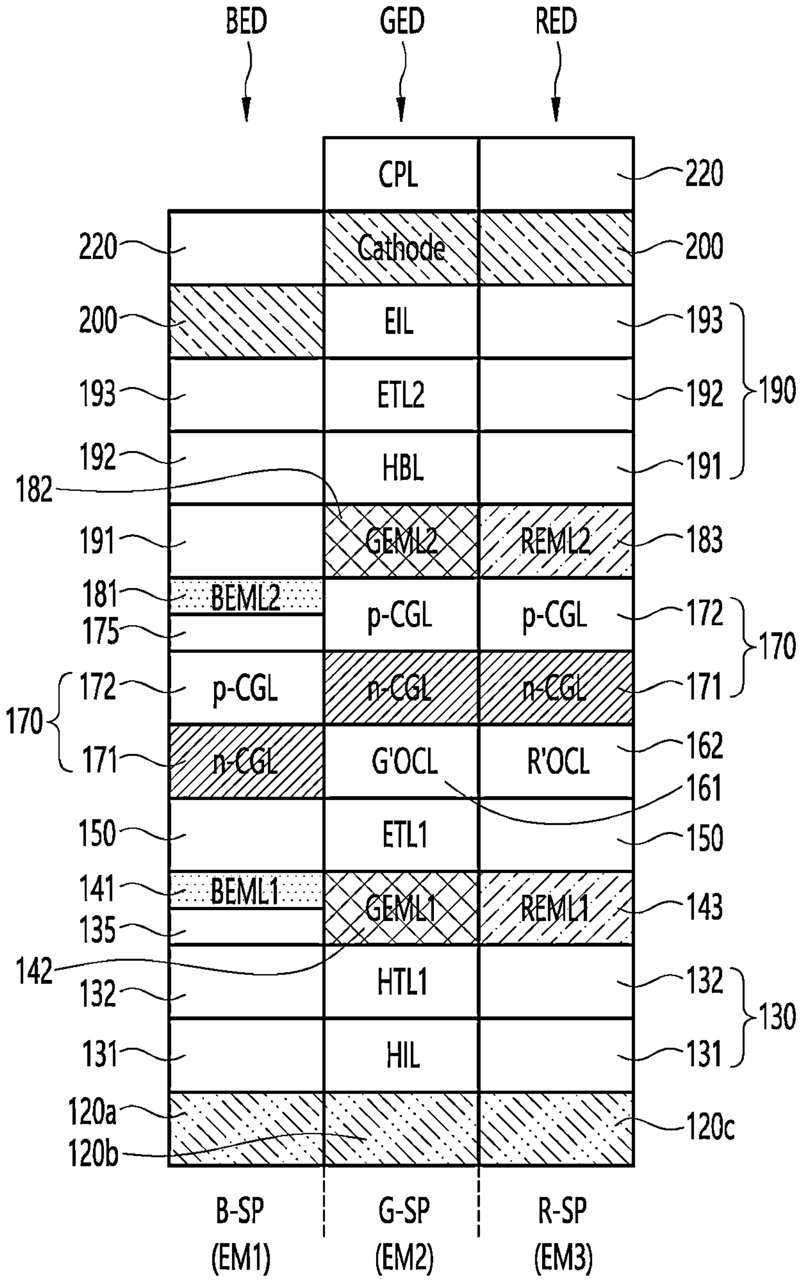
FIG. 3 is a cross-sectional view illustrating a light emitting element of a light emitting display device according to a first embodiment of the present disclosure.

FIG. 2 is an enlarged plan view of area A of FIG. 1 according to an embodiment of the light emitting display device of the present disclosure. FIG. 3 is a cross-sectional view illustrating a light emitting element of a light emitting display device according to a first embodiment of the present disclosure.

FIG. 2 illustrates an example of the light emitting display device of the present disclosure, in which a plurality of light emitting portions EM1, EM2, and EM3 is arranged side by side. When first to third light emitting portions EM1, EM2, and EM3 are disposed, the light emitting portions may be light emitting portions emitting different colors. For example, the first light emitting portion EM1 may be a blue light emitting portion, the second light emitting portion EM2 may be a green light emitting portion, and the third light emitting portion EM3 may be a red light emitting portion. The first to third light emitting portions EM1, EM2, and EM3 form one pixel, and may be repeatedly disposed on the substrate 110 in the order of the first to third light emitting portions EM1, EM2, and EM3. Accordingly, one side of the first light emitting portion EM1 is adjacent to the second light emitting portion EM2, and the other side thereof is adjacent to the third light emitting portion EM3.

The first to third light emitting portions EM1, EM2, and EM3 may be defined as exposed parts of banks 125. Outer areas of the first to third light emitting portions EM1, EM2, and EM3 overlapping the banks 125 may be non-light emitting portions.

Each of the first to third light emitting portions EM1, EM2, and EM3 is included in the sub-pixel SP described in FIG. 1.

In the light emitting display device according to the embodiment of the present disclosure, a lateral inclined portion of the bank 125 may include a configuration of a light emitting element to emit light, so that each of the first to third light emitting portions EM1, EM2, and EM3 may partially overlap with the bank 125.

Meanwhile, in the light emitting display device of the present disclosure, optical compensation layers 161 and 162 may be included in at least one of the light emitting portions EM2 and EM3. FIG. 2 illustrates an example in which the first optical compensation layer 161 is provided in the second light emitting portion EM2, the second optical compensation layer 162 is provided in the third light emitting portion EM3, and an optical compensation layer is not provided in the first light emitting portion EM1. The first and second optical compensation layers 161 and 162 are formed independently and spaced apart from each other.

The first optical compensation layer 161 between the first light emitting portion EM1 and the second light emitting portion EM2 covers the entire second light emitting portion EM2, partially extends outward with respect to the second light emitting portion EM2, and is spaced apart from the first light emitting portion EM1. Therefore, the first optical compensation layer 161 has a non-formation area NFA between the first light emitting portion EM1 and the second light emitting portion EM2.

In addition, the second optical compensation layer 162 between the first light emitting portion EM1 and the third light emitting portion EM3 covers the entire third light emitting portion EM3, partially extends outward with respect to the third light emitting portion EM3, and is spaced apart from the first light emitting portion EM1. Therefore, the second optical compensation layer 162 has a non-formation area NFA between the first light emitting portion EM1 and the third light emitting portion EM3.

In the light emitting display device of the present disclosure, the first and second optical compensation layers 161 and 162 are provided in the second and third light emitting portions EM2 and EM3, respectively, to serve to adjust resonance distances of the respective light emitting portions. In addition, each of the optical compensation layers causes a step between a formed part and a non-formed part to generate disconnection of a charge generation layer formed at a top or thin thickness of the charge generation layer, thereby lengthening a path between adjacent light emitting portions, so that lateral leakage current may be prevented or lateral leakage current may be minimized or reduced by increasing resistance.

Meanwhile, FIG. 2 illustrates a form having the second light emitting portion EM2 and the third light emitting portion EM3 excluding the first emitting portion EM1. However, the present disclosure is not limited thereto. For example, the optical compensation layer 161 or 162 may be provided in either the second light emitting portion EM2 or the third light emitting portion EM3.

Alternatively, the optical compensation layer 161 or 162 may be provided in each of the first light emitting portion EM1, the second light emitting portion EM2, and the third light emitting portion EM3. When all of the first, second, and third light emitting portions EM1, EM2, and EM3 are provided with the optical compensation layers, respectively, separately and independently forming the optical compensation layers corresponding to the respective light emitting portions is advantageous in preparing a formation part of the optical compensation layer and a stepped part due to the non-formation area. That is, it is preferable to have a non-formation area NFA between optical compensation layers on the banks 125 between adjacent light emitting portions.

That is, in the light emitting display device of the present disclosure, the optical compensation layer is provided in the light emitting element to adjust an optical distance at which light emitted from a light emitting layer between a first electrode and a second electrode of the light emitting element resonates due a thickness thereof, and is located below the charge generation layer, which is a layer with high mobility among components inside the light emitting element, to decrease a thickness of the charge generation layer between adjacent light emitting portions or generate disconnection, so that lateral leakage current may be prevented.

Light emitting element structures BED, GED, and RED of the respective light emitting portions EM1, EM2, and EM3 of the light emitting display device according to the first embodiment of the present disclosure will be examined with reference to FIG. 3.

The blue light emitting element BED is formed in the first light emitting portion EM1, the green light emitting element GED is formed in the second light emitting portion EM2, and the red light emitting element RED is formed in the third light emitting portion EM3. The blue light emitting element BED, the green light emitting element GED, and the red light emitting element RED include a plurality of stacks 131 to 150 and 175 to 193 between first electrodes 120*a*, 120*b*, and 120*c* and a second electrode 200 facing each other, respectively, and each include a functional part including a charge generation layer 170 between the plurality of stacks 131 to 150 and 175 to 193. Each layer of the functional part is made of an organic layer as a main material, and each layer may be formed through a deposition process.

The first electrodes 120*a*, 120*b*, and 120*c* of the first to third light emitting portions EM1, EM2, and EM3 are formed separately from each other and are each independently connected to a thin film transistor (TFT of FIG. 3) on a lower side, so that the first to third light emitting portions EM1, EM2, and EM3 may be independently turned on/turned off and driven. The second electrode 200 is integrally provided in the first to third light emitting portions EM1, EM2, and EM3, and a common voltage is supplied thereto. For example, the second electrode 200 is provided over the entire active area of the substrate and extends to the outside to supply a ground signal, a low-voltage signal, or a VSS signal as a common voltage.

The first electrodes 120*a*, 120*b*, and 120*c* may each include a reflective electrode, and the second electrode 200 may include a transparent electrode or a reflective/transmissive electrode. For example, when each of the first electrodes 120*a*, 120*b*, and 120*c* includes a reflective electrode, the first electrodes 120*a*, 120*b*, and 120*c* may each have a multilayer structure including a transparent conductive film and an opaque conductive film having high reflective efficiency. The transparent conductive film of each of the first electrodes 120*a*, 120*b*, and 120*c* may be made of a material having a relatively large work function value such as indium tin oxide (ITO) or indium zinc oxide (IZO), and the opaque conductive film may be configured as a single layer or multiple layers of any one selected from the group consisting of silver (Ag), aluminum (Al), copper (Cu), molybdenum (Mo), titanium (Ti), nickel (Ni), chromium (Cr), or tungsten (W) or an alloy thereof. For example, each of the first electrodes 120*a*, 120*b*, and 120*c* may be formed of a structure in which a transparent conductive film, an opaque conductive film, and a transparent conductive film are sequentially stacked, or formed of a structure in which a transparent conductive film and an opaque conductive film are sequentially stacked. For example, each of the first electrodes 120*a*, 120*b*, and 120*c* may include a stacked structure of ITO/Ag/ITO.

For example, the second electrode 200 may be made of a transparent conductive material such as ITO or IZO, and may be made of silver (Ag), aluminum (Al), magnesium (Mg), calcium (Ca), ytterbium (Yb), or an alloy including at least one of these materials, having a sufficiently small thickness to transmit light. When the second electrode 200 is made of a metal or a metal alloy having a sufficiently small thickness to transmit light, the second electrode 200 has reflective transmittance, and thus light resonated between the first electrodes 120*a*, 120*b*, and 120*c* and the second electrode 200 has strong cavity characteristics and may be transmitted through the second electrode 200.

From a viewpoint of polarity of a voltage signal, the first electrodes 120*a*, 120*b*, and 120*c* may be referred to as anodes, and the second electrode 200 may be referred to as a cathode. Alternatively, from a viewpoint of a patterned shape, the first electrodes 120*a*, 120*b*, and 120*c* may be referred to as pixel electrodes, and the second electrode 200 may be referred to as a common electrode.

Meanwhile, the present disclosure is not limited to the above example, and in the light emitting display device according to an embodiment of the present disclosure, the first electrodes 120*a*, 120*b*, and 120*c* may each include a transparent electrode, and the second electrode 200 may include a reflective electrode.

Specifically, in the blue light emitting element BED, a stack between the first electrode 120*a* and the charge generation layer 170 may include a hole transport-related layer 130, a first blue light emitting layer 141, and a first electron transport layer 150. In the blue light emitting element BED, a stack between the charge generation layer 170 and the second electrode 200 may include a second electron blocking layer 175, a second blue light emitting layer 181, and an electron transport-related layer 190.

In the blue light emitting element BED, the hole transport-related layer 130 may include, for example, a hole injection layer 131, a hole transport layer 132, and a first electron blocking layer 135. The hole injection layer 131, the hole transport layer 132, and the first electron blocking layer 135 each include a hole transport material, and may each be formed by adding a material having characteristics of adjusting a barrier or limiting or adjusting carrier mobility at an interface. The hole injection layer 131 is an organic layer that reduces resistance when holes are injected at an interface of the first electrode 120*a*. The hole transport layer 132 transfers holes injected through the hole injection layer 131 to the first blue light emitting layer 141. The first electron blocking layer 135 is a layer located between the hole transport layer 132 and the first blue light emitting layer 141 so that, when electrons move from the charge generation layer 170 at a high speed, the electrons are prevented from passing through the first blue light emitting layer 141 and escaping through the hole transport layer 132 on a lower side, and are confined in the first blue light emitting layer 141.

In the light emitting display device according to the first embodiment of the present disclosure according to FIG. 3, the first light emitting portion EM1 of the blue light emitting element BED further includes the first electron blocking layer 135 when compared to the green light emitting element GED of the second light emitting portion EM2 or the red light emitting element RED of the third light emitting portion EM3. A reason therefor is that the first and second optical compensation layers 161 and 162 are provided between the first electron transport layer 150 and the charge generation layer 170 in the second light emitting portion EM2 and the third light emitting portion EM3, respectively. That is, vertical distances from the charge generation layer 170 to the first green light emitting layer 142 and the first red light emitting layer 143 are longer than a vertical distance from the charge generation layer 170 to the first blue light emitting layer 141. When the first electron blocking layer 135 is not provided, some of electrons entering the first blue light emitting layer 141 may pass to the hole transport layer 132 on the lower side without being used for recombination due to a difference between the vertical distances from the charge generation layer 170 to the respective light emitting layers 141, 142, and 143. However, the blue light emitting element BED of the light emitting display device of the present disclosure is provided with the first electron blocking layer 135, so that electrons may be confined in the first blue light emitting layer 141 and used for recombination of holes and electrons.

A light emitting display device according to another embodiment of the present disclosure may further include the first electron blocking layer 135 not only in the blue light emitting element BED, but also in each of the red light emitting element RED and the green light emitting element GED. When the first electron blocking layer 135 is common to the blue light emitting element BED, the green light emitting element GED, and the red light emitting element RED, the first electron blocking layer 135 may be formed by an open mask without a fine metal deposition mask.

The charge generation layer 170 may include an n-type charge generation layer 171 configured to generate electrons and transfer the electrons to a stack on a lower side and a p-type charge generation layer 172 configured to generate holes and transfer the holes to a stack on an upper side.

In some cases, the p-type charge generation layer 172 in the charge generation layer 170 may also serve as a hole transport layer of a stack on an upper side. In another embodiment, separately from the p-type charge generation layer 172, a hole transport layer may be further provided between the p-type charge generation layer 172 and each of the second blue light emitting layer 181, a second green light emitting layer 182, and a second red light emitting layer 183 (not illustrated in FIG. 3).

In the blue light emitting element BED, the second electron blocking layer 175 may be provided on the p-type charge generation layer 172. The second electron blocking layer 175 is made of a hole transport material and may confine electrons to the second blue light emitting layer 181. The first to third light emitting portions EM1, EM2, and EM3 may be provided with light emitting layers emitting different colors, respectively, and among these light emitting layers, the first and second blue light emitting layers 141 and 181 emitting blue light may be deposited thinner than light emitting layers of other colors, that is, the first and second green light emitting layers 142 and 182 and the first and second red light emitting layers 143 and 183. In the light emitting display device of the present disclosure, the first and second electron blocking layers 135 and 175 are provided respectively below the first and second blue light emitting layers 141 and 181, so that electrons are prevented from being pushed to the hole transport layer 132 or the charge generation layer 170 below the first and second blue light emitting layers 141 and 181, electrons are confined in the first and second blue light emitting layers 141 and 181, and a recombination rate of electrons and holes in the first and second blue light emitting layers 141 and 181 may be improved.

A light emitting display device according to another embodiment of the present disclosure may further include the second electron blocking layer 175 not only in the blue light emitting element BED, but also in each of the red light emitting element RED and the green light emitting element GED. When the second electron blocking layer 175 is common to the blue light emitting element BED, the green light emitting element GED, and the red light emitting element RED, the second electron blocking layer 175 may be formed by an open mask regardless of the light emitting elements.

In some cases, when supplied electrons in the first and second blue light emitting layers 141 and 181 can be confined by changing the material and thickness of the first and second blue light emitting layers 141 and 181, the first and second electron blocking layers 135 and 175 may be omitted.

The electron transport-related layer 190 on the second blue light emitting layer 181 may include a hole blocking layer 191, a second electron transport layer 192, and an electron injection layer 193. The hole blocking layer 191 and the second electron transport layer 192 may comprise an electron transport material, and either layer may be omitted. The electron injection layer 193 may include an inorganic material or an inorganic compound to reduce interface resistance and reduce a barrier when electrons pass the second electrode 200 to the second electron transport layer 192. In some cases, the second electron injection layer 193 may be made of only an inorganic material or an inorganic compound, and in this case, the second electron injection layer 193 may be sequentially formed in a deposition process of the second electrode 200.

A capping layer 220 is a layer provided to protect each of the light emitting elements BED, GED, and RED and to increase light emission efficiency of each of the light emitting elements BED, GED, and RED. The capping layer 220 may be formed of stacks having different refractive indices. The capping layer 220 may be formed as a stacked layer of different materials, for example, an inorganic material and an organic material. The capping layer 220 may also be formed in a process of forming the second electrode 200. For example, the electron injection layer 193, the second electrode 200, and the capping layer 220 may be sequentially formed together in the process of forming the second electrode 200. The capping layer 220 may also be formed in a deposition process of the light emitting element, and thus is included as a component of each of the light emitting elements BED, GED, and RED.

In the green light emitting element GED, a stack between the first electrode **120*b* and the charge generation layer 170 may include the hole transport-related layer 130, the first green light emitting layer 142, the first electron transport layer 150, and the first optical compensation layer 161. In the green light emitting element GED, a stack between the charge generation layer 170 and the second electrode 200 may include the second green light emitting layer 182 and the electron transport-related layer 190**.

The first optical compensation layer 161 may directly contact the n-type charge generation layer 171 of the charge generation layer 170.

In the red light emitting element RED, a stack between the first electrode **120*c* and the charge generation layer 170 may include the hole transport-related layer 130, the first red light emitting layer 143, the first electron transport layer 150, and the second optical compensation layer 162. In the green light emitting element RED, a stack between the charge generation layer 170 and the second electrode 200 may include the second red light emitting layer 183 and the electron transport-related layer 190**.

The second optical compensation layer 162 may directly contact the n-type charge generation layer 171 of the charge generation layer 170.

In the blue light emitting element BED, the green light emitting element GED, and the red light emitting element RED, the first and second blue light emitting layers 141 and 181, the first and second green light emitting layers 142 and 182, the first and second red light emitting layers 143 and 183, the first and second electron blocking layers 135 and 175, and the first and second optical compensation layers 161 and 162 may be separately provided in the first to third light emitting portions EM1, EM2, and EM3. In contrast, the hole injection layer 131, the hole transport layer 132, the first electron transport layer 150, the n-type charge generation layer 171, the p-type charge generation layer 172, the hole blocking layer 191, the electron transport layer 192, the electron injection layer 193, and the second electrode 200 are commonly provided in the first to third light emitting portions EM1, EM2, and EM3, and may be integrally formed in the active area AA using an open mask that opens the entire active area AA of the substrate 110.

The light emitting display device of the present disclosure has unevenness or disconnection of the charge generation layer 170 between adjacent light emitting portions by including the first and second optical compensation layers 161 and 162 and steps of non-formation areas thereof, and thus may prevent lateral leakage current caused by the charge generation layer 170.

Hereinafter, a principle of solving lateral leakage current in the light emitting display device of the present disclosure will be described with reference to a specific structure between adjacent light emitting portions.

Figure 4:
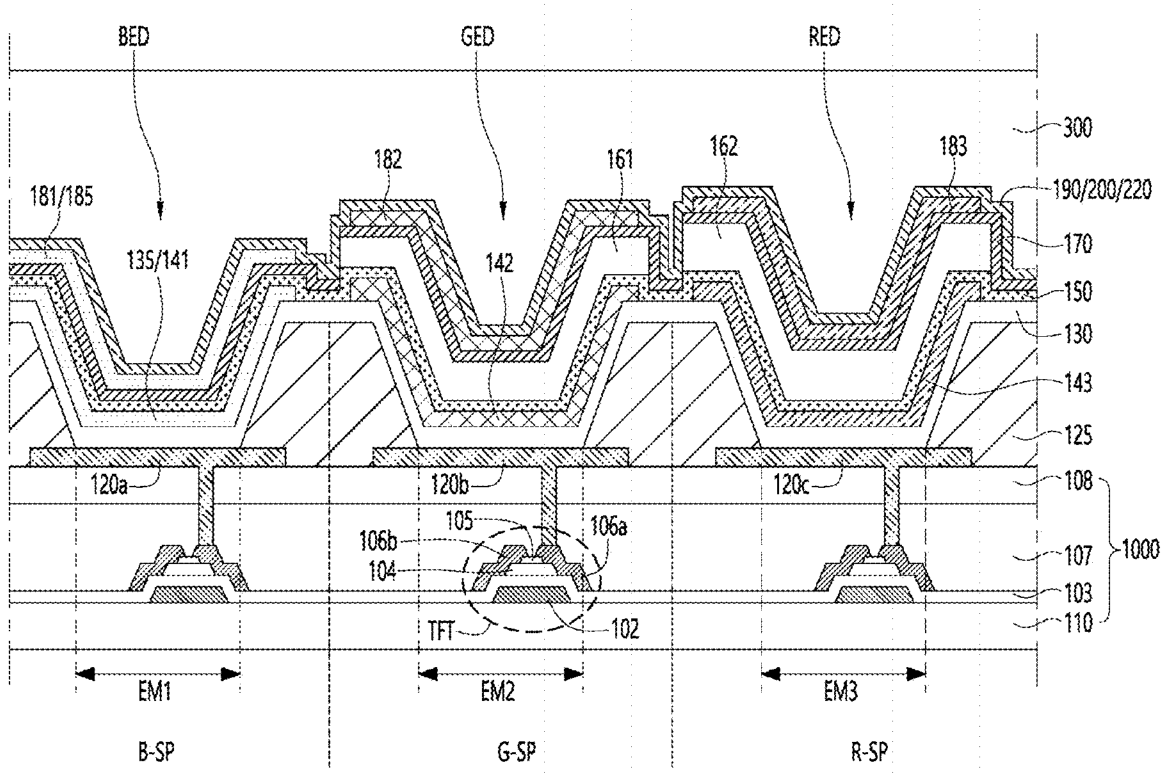
FIG. 4 is a cross-sectional view illustrating the light emitting display device including the light emitting element of FIG. 3 according to an embodiment of the present disclosure.
Figure 5:
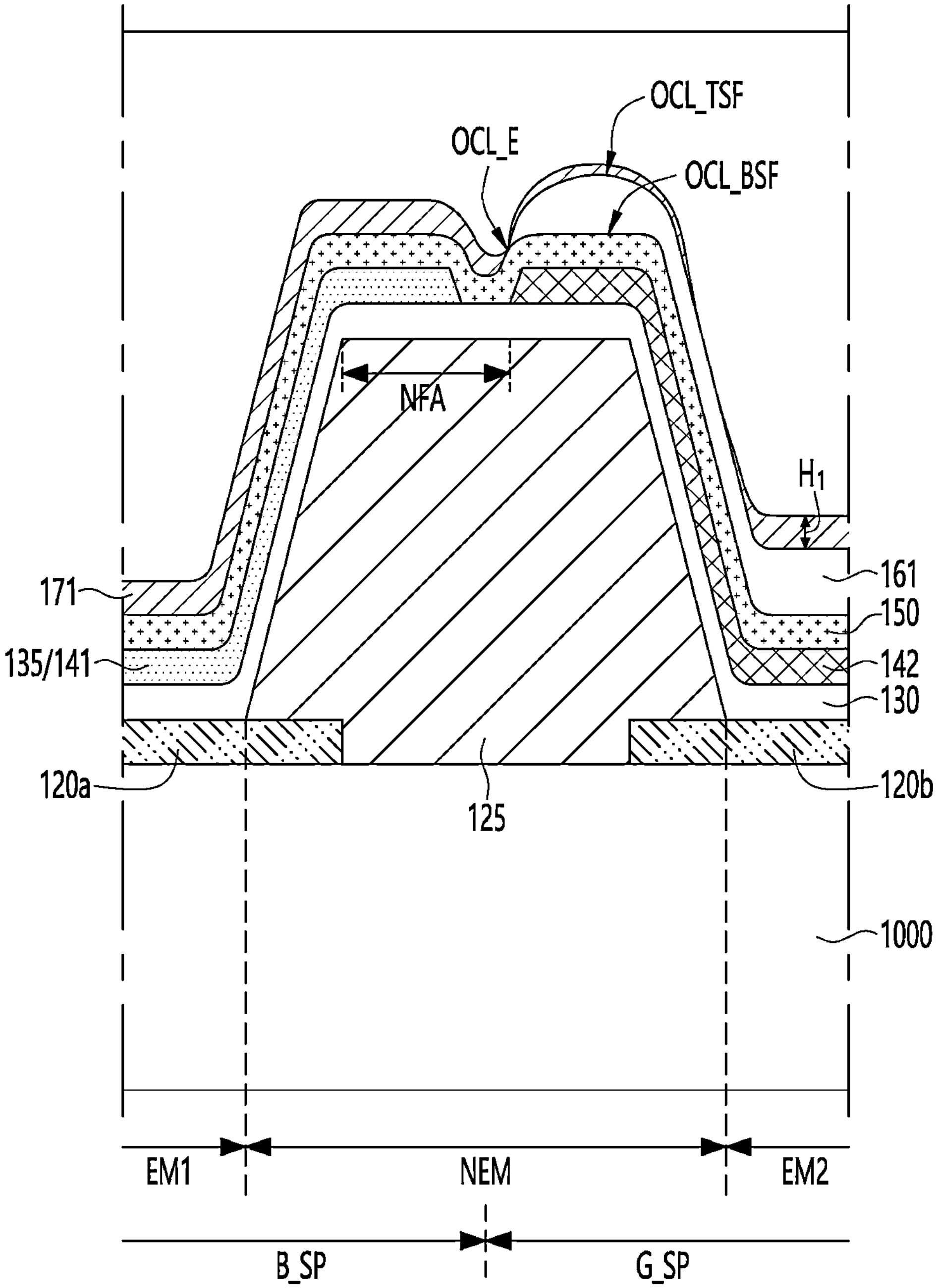
FIG. 5 is a cross-sectional view illustrating a configuration between a first electrode and an n-type charge generation layer in a region between a first light emitting portion and a second light emitting portion of FIG. 4 according to an embodiment.
Figure 6:
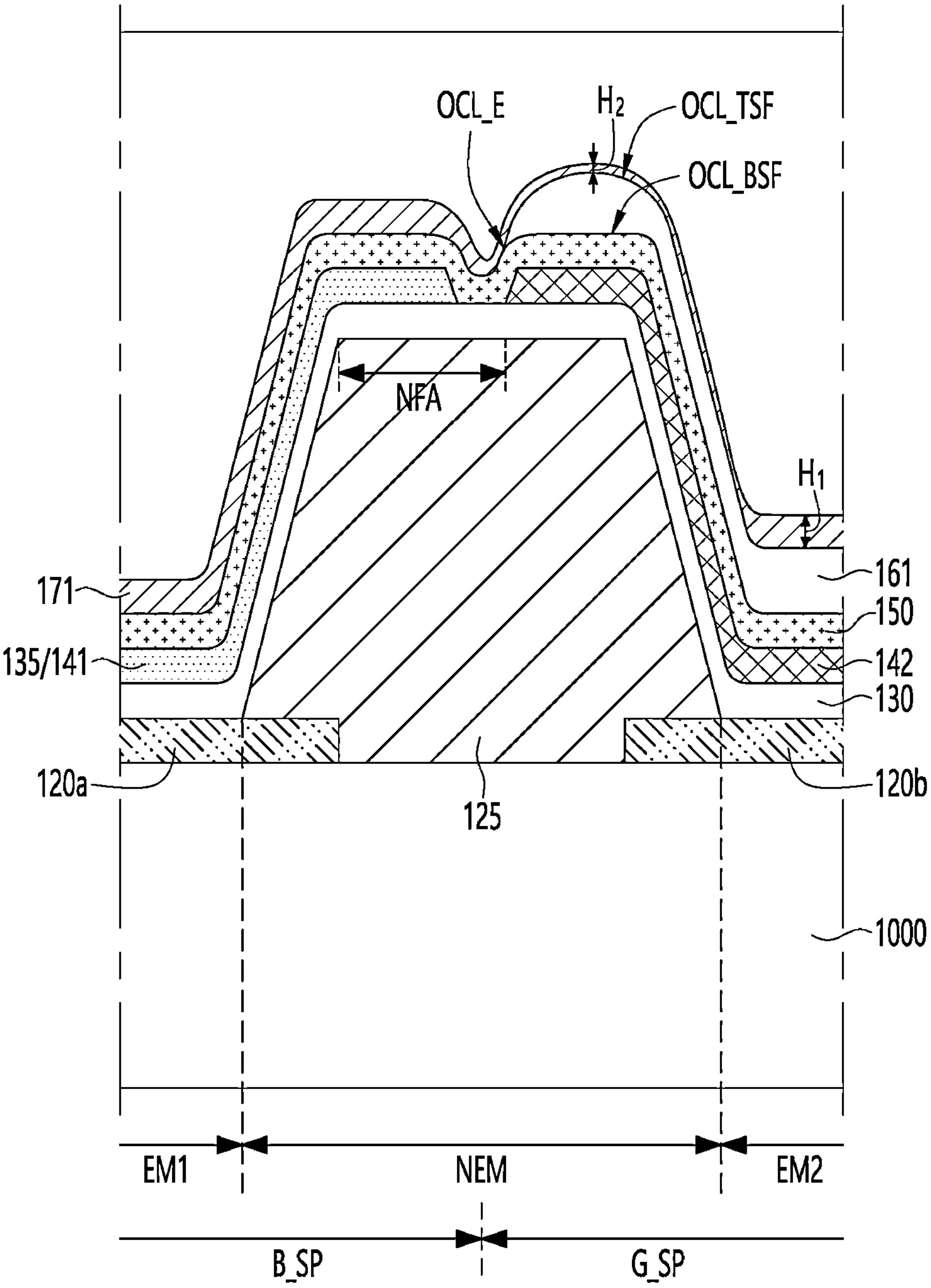
FIG. 6 is a cross-sectional view illustrating a configuration between the first electrode and the n-type charge generation layer in the region between the first light emitting portion and the second light emitting portion of FIG. 4 according to another embodiment.

FIG. 4 is a cross-sectional view illustrating the light emitting display device including the light emitting element of FIG. 3 according to an embodiment. FIG. 5 is a cross-sectional view illustrating a configuration between the first electrode and the n-type charge generation layer in a region between the first light emitting portion and the second light emitting portion of FIG. 4 as an embodiment. FIG. 6 is a cross-sectional view illustrating a configuration between the first electrode and the n-type charge generation layer in the region between the first light emitting portion and the second light emitting portion of FIG. 4 according to another embodiment.

As illustrated in FIG. 4, the light emitting display device according to the embodiment of the present disclosure includes a blue sub-pixel B-SP, a green sub-pixel G-SP, and a red sub-pixel R-SP, which include the blue light emitting element BED, the green light emitting element GED, and the red light emitting element RED, respectively. The sub-pixels B-SP, G-SP, and R-SP include the light emitting portions EM1, EM2, and EM3 at centers thereof, respectively.

The light emitting elements BED, GED, and RED may be formed on a thin film transistor array substrate 1000 to correspond to at least the light emitting portions EM1, EM2, and EM3, respectively.

The thin film transistor array substrate 1000 includes the substrate 110, thin film transistors TFTs, and protective films 107 and 108, and contact holes are provided in the protective films 107 and 108 so that the thin film transistors TFTs are in contact with the first electrodes 120*a*, 120*b*, and 120*c* of the light emitting elements BED, GED, and RED, respectively.

For example, the thin film transistor TFT includes a gate electrode 102, a semiconductor layer 104 overlapping the gate electrode 102 and provided with a gate insulating film 103 interposed therebetween, and a source electrode 106*a* and a drain electrode 106*b* connected to both sides of the semiconductor layer 104, respectively.

The semiconductor layer 104 may include at least one of polysilicon, amorphous silicon, or an oxide semiconductor layer. In addition, the semiconductor layer 104 may be provided by stacking semiconductor layers of the same or different types.

The illustrated thin film transistor TFT is an example, and a plurality of thin film transistors may be included in a sub-pixel, and structures of the plurality of thin film transistors may be different from each other.

A channel of the thin film transistor TFT may be protected by a channel protection layer 105. In some cases, the channel protection layer 105 may be omitted.

As illustrated, the protective films 107 and 108 protecting the thin film transistor TFT may be divided into a first protective film 107 and a second protective film 108, or may be provided as one protective film. The first and second protective films 107 and 108 may be divided into, for example, an inorganic protective film and an organic protective film by using different components. In some cases, at least one of the inorganic protective film or the organic protective film may be a plurality of layers.

The first electrodes 120*a*, 120*b*, and 120*c* of the light emitting element BED, GED, and RED are connected to the thin film transistors TFTs through the contact holes provided in the first and second protective films 107 and 108, respectively, and are formed on the second protective film 108. The first electrodes 120*a*, 120*b*, and 120*c* may be spaced apart from adjacent first electrodes between adjacent light emitting portions EM1, EM2, and EM3 and formed in areas larger than those of the light emitting portions EM1, EM2, and EM3, respectively.

The banks 125 are provided to cover edges of the first electrodes 120*a*, 120*b*, and 120*c* and expose the light emitting portion EM1, EM2, and EM3 of the first electrodes 120*a*, 120*b*, and 120*c*.

The banks 125 may have lateral inclined portions having acute slopes with respect to upper surfaces of the first electrodes 120*a*, 120*b*, and 120*c* at portions overlapping the first electrodes 120*a*, 120*b*, and 120*c*, respectively. The lateral inclined portions of the banks 125 may include configurations of the light emitting element BED, GED, and RED, respectively, and thus the lateral inclined portions of the banks 125 may be used as light emitting portions.

As described above with reference to FIG. 3, among the components between the first electrodes 120*a*, 120*b*, and 120*c* and the second electrode 200, the first and second blue light emitting layers 141 and 181, the first and second green light emitting layers 142 and 182, the first and second red light emitting layers 143 and 183, and the first and second optical compensation layers 161 and 162 are each formed using a fine metal mask (FMM) having an opening finely adjusted for each light emitting portion. However, other layers 130, 150, 170, 190, 200, and 220 are each formed by an open mask for the active area AA of the substrate 110.

The encapsulation layer 300 may be formed on the respective light emitting elements BED, GED, and RED including the first electrodes 120*a*, 120*b*, and 120*c*, the second electrode 200, and the capping layer 220 facing each other to protect the light emitting elements BED, GED, and RED from outside air and moisture. The encapsulation layer 300 may be, for example, an encapsulation substrate or a thin film encapsulation structure in which an inorganic layer and an organic layer are alternately formed.

A layer configured to generate charge in the light emitting element and transfer and supply the charge to an adjacent stack, such as the charge generation layer 170, includes a material having high mobility. Therefore, the charge generation layer 170 commonly formed across the adjacent light emitting portions EM1, EM2, and EM3 of the thin film transistor array substrate 1000 has excellent carrier mobility direction and may cause carrier movement in the horizontal direction.

The light emitting display device of the present disclosure includes the first optical compensation layer 161 and the second optical compensation layer 162 having a thickness greater than that of the charge generation layer 170 below the charge generation layer 170, and increases a step of a part where a lower surface of the charge generation layer 170 passes using a step with a part where the first optical compensation layer 161 and the second optical compensation layer 162 are not formed.

Specifically, as illustrated in FIG. 5, disconnection of the n-type charge generation layer 171 may be generated in a partial area. Alternatively, as illustrated in FIG. 6, using a step between the first optical compensation layer 161 (and the second optical compensation layer 162) and a part where the first and second optical compensation layers 161 and 162 are not formed, in a part where the step is large, a thickness of the n-type charge generation layer 171 is decreased, and a path of a part where the n-type charge generation layer 171 passes is lengthened, so that resistance of the n-type charge generation layer 171 is increased to significantly decrease lateral leakage current between adjacent light emitting portions.

As illustrated in FIGS. 4 to 6, the first optical compensation layer 161 and the second optical compensation layer 162 are not only provided on the light emitting portions, but also are each formed in a part of an upper surface of a bank 125 on a non-light emitting portion NEM adjacent to a light emitting portion by overlapping the part of the bank 125. Therefore, the first optical compensation layer 161 (the second optical compensation layer 162) may have an edge OCL_E on the bank 125 located between the optical compensation layer 161/162 and the first light emitting portion EM1 adjacent to the second light emitting portion EM2 (the third light emitting portion EM3). The edge OCL_E of the first optical compensation layer 161 may be the same or similar to an edge of the first green light emitting layer 142. The edge of the second optical compensation layer 162 may be the same as an edge of the first red light emitting layer 143. When the areas of the first optical compensation layer 161 and the first green light emitting layer 142 are the same, an FMM mask for forming the first green light emitting layer 142 may be used when the first optical compensation layer 161 is formed. Similarly, when the areas of the second optical compensation layer 162 and the first red light emitting layer 143 are the same, an FMM mask for forming the first red light emitting layer 143 may be used when the second optical compensation layer 162 is formed.

Meanwhile, if a turn-on voltage of the blue light emitting element BED is relatively high, and thus lateral leakage current is generated during low-luminance driving, when only the blue light emitting element BED of the first light emitting portion EM1 is turned on, low-luminance color mixing may occur in which the green light emitting element GED of the second light emitting portion EM2 or the red light emitting element RED of the third light emitting portion EM3, which is adjacent thereto and has a low turn-on voltage, weakly emits light. In addition, lateral leakage current is caused by a layer having high mobility, and may be induced in a layer having high mobility, such as the charge generation layer 170, for example.

The light emitting display device of the present disclosure includes an optical compensation layer non-formation area NFA on a bank 125 around the first light emitting portion EM1 equipped with the blue light emitting element BED, and includes the first optical compensation layer 161 or the second optical compensation layer 162 in a partial area on a bank 125 around the second light emitting portion EM2 and/or the third light emitting portion EM3. Therefore, in the n-type charge generation layer 171 formed after formation of the first and second optical compensation layers 161 and 162, disconnection is generated at the edge OCL_E of the first optical compensation layer 161 or the second optical compensation layer 162 as illustrated in FIG. 5 due to a step between the optical compensation layer non-formation area NFA and an optical compensation layer formation area around the blue light emitting element BED. Therefore, even when current generated in the first light emitting portion EM1 flows to a side through the n-type charge generation layer 171, transfer of the lateral leakage current to the second light emitting portion EM2 is blocked.

In addition, in the light emitting display device of the present disclosure, the charge generation layer formed thinner than the first and second optical compensation layers 161 and 162 is formed along surface irregularities of the first and second optical compensation layers 161 and 162 and the surface of the first electron transport layer 150 of the optical compensation layer non-formation area NFA. Thus, as illustrated in FIG. 6, the n-type charge generation layer 171 may have a long path and a small thickness between the first and second light emitting portions EM1 and EM2. Therefore, even when a current generated in the first light emitting portion EM1 flows through sideways the n-type charge generation layer 171, transfer of the lateral leakage current to the second light emitting portion EM2 may be minimized or reduced to prevent color mixing due to the lateral leakage current.

As in FIG. 5 or 6, in the non-light emitting portion NEM between the first light emitting portion EM1 and the second light emitting portion EM2 and between the first light emitting portion EM1 and the third light emitting portion EM3, due to a step between the edge OCL_E of the optical compensation layer and the non-formation area NFA of the optical compensation layer, a thickness difference for each region of the n-type charge generation layer 171 is then reflected in the p-type charge generation layer 172 on the n-type charge generation layer 171 and common layers of an upper stack, such as a hole transport layer, a hole blocking layer, and an electron transport layer, and disconnection or path lengthening may occur in the common layers.

The optical compensation layer non-formation area NFA is provided on an upper surface of the bank 125 adjacent to the edge OCL_E of each of the first and second optical compensation layers 161 and 162, and the charge generation layer 170 may directly contact the electron transport layer 150 at a lower stack in the optical compensation layer non-formation area NFA.

Each of the first and second optical compensation layers 161 and 162 may be thicker than the charge generation layer 170. For example, a step is generated around the edge OCL_E of each of the first optical compensation layer 161 and the second optical compensation layer 162, and thus to thinly form the charge generation layer 170, each of the first and second optical compensation layers 161 and 162 may have a thickness of 1.5 to 10 times a thickness of the charge generation layer 170.

Lower surfaces OCL_BSF of the first and second optical compensation layers 161 and 162 are located on the first electron transport layer 150, and upper surfaces OCL_TSF thereof are in contact with the lower surface of the charge generation layer 170, so that a path on the lower surface of the charge generation layer 170 may be increased.

The first optical compensation layers 161 and 162 may comprise an electron transport material. A reason therefor is that the first and second optical compensation layers 161 and 162 are located on the lower surface of the charge generation layer 170 to be able to transfer electrons from the charge generation layer 170 to the first green light emitting layer 142 and the first red light emitting layer 143 on the lower side.

In addition, as illustrated in FIG. 6, the charge generation layer 170 has a thickness H2 on the first optical compensation layer 161 or the second optical compensation layer 162 on the bank 125 between the first and second light emitting portions EM1 and EM2 or the first and third light emitting portions EMI and EM3 smaller than a thickness H1 thereof on the first optical compensation layer 161 or the second optical compensation layer 162 located in each of the light emitting portions EM1 and EM2.

As illustrated in FIGS. 4 to 6, the first light emitting portion EM1 does not have an optical compensation layer, and on the bank 125 adjacent to the first light emitting portion EM1, the charge generation layers 170 and 171 may come into contact with the first electron transport layer 150 of a stack below the charge generation layer 170 and then come into contact with the first optical compensation layer 161 or the second optical compensation layer 162 adjacent thereto as a distance from the first light emitting portion EM1 increases.

Meanwhile, the optical compensation layer may also serve to adjust a resonance distance in the order of red, green, and blue. Accordingly, as illustrated in FIG. 4, the second optical compensation layer 162 positioned in the third light emitting portion EM3 emitting red light may be thicker than the first optical compensation layer 161 positioned in the second light emitting portion EM2 emitting green light. Even when an optical compensation layer is further provided in the first light emitting portion EMI emitting blue light, the optical compensation layer may be provided in order of thicknesses of blue, green, and red.

Hereinafter, an effect of the light emitting display device of the present disclosure will be examined through experiments.

Figure 7:
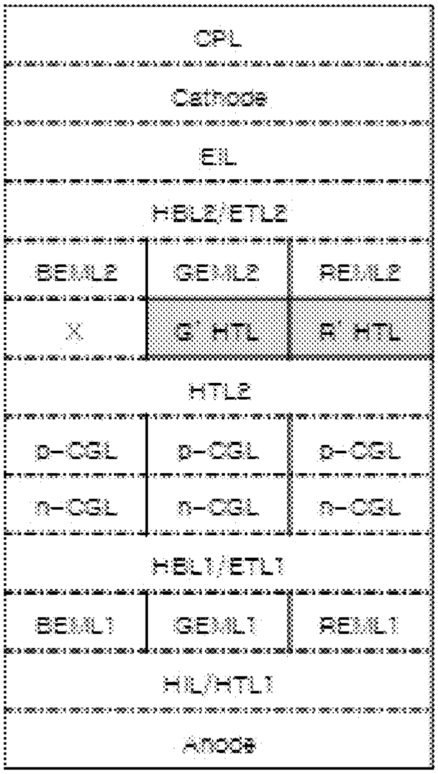
FIG. 7 is a cross-sectional view illustrating a light emitting display device according to a first experimental example.
Figure 8:
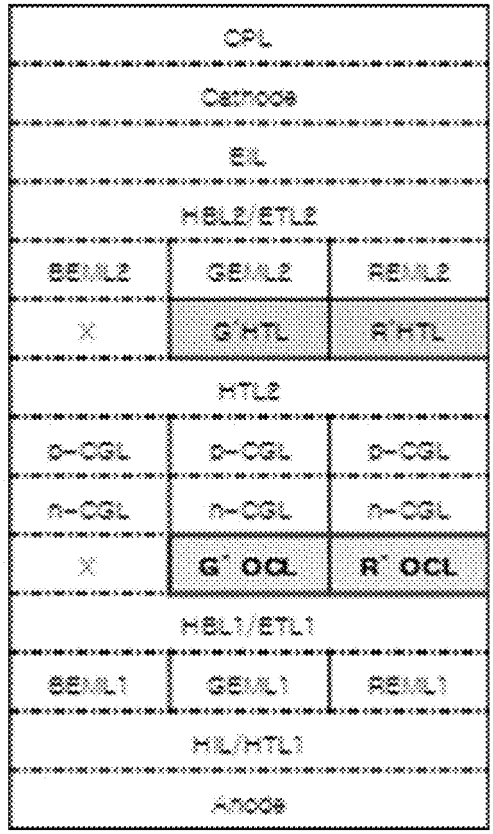
FIG. 8 is a cross-sectional view illustrating a light emitting display device according to a second experimental example.
Figure 9:
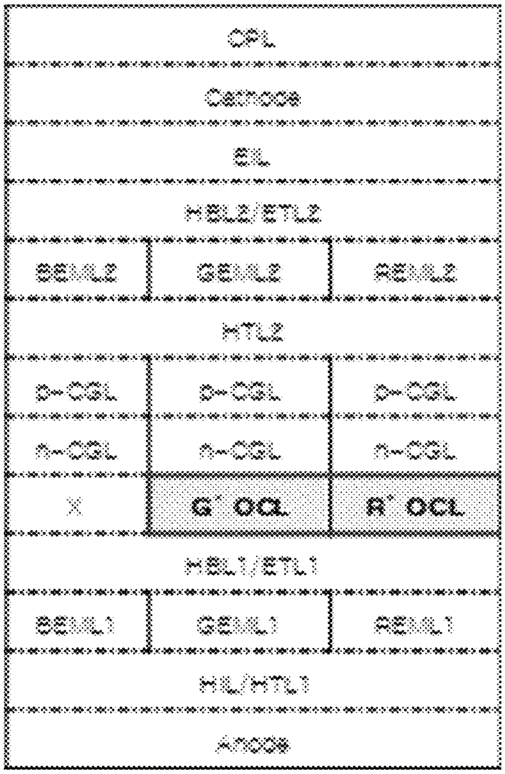
FIG. 9 is a cross-sectional view illustrating a light emitting display device according to a third experimental example.
Figure 10:
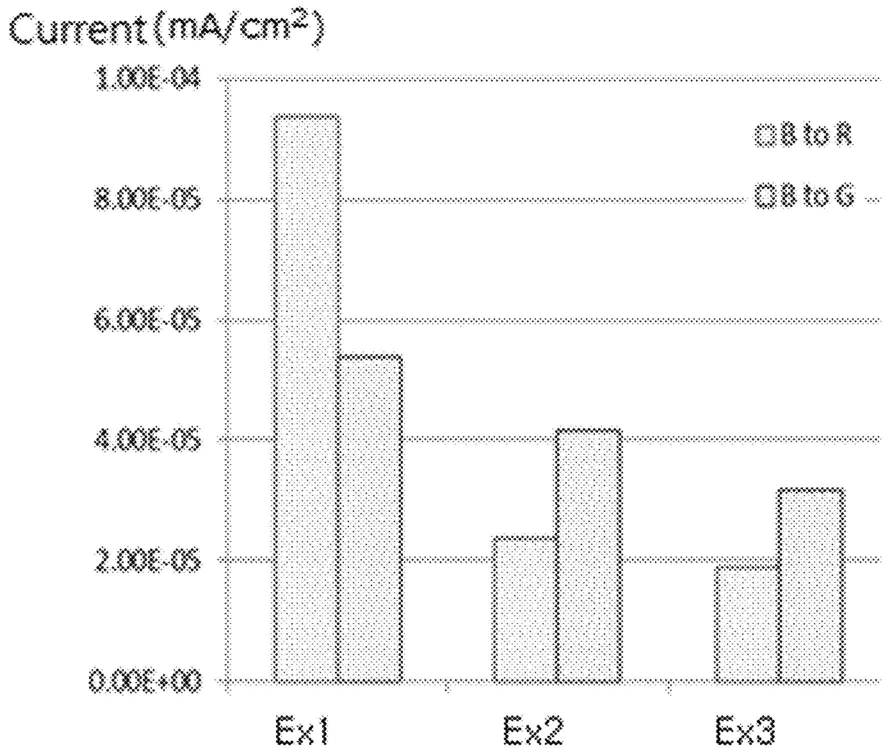
FIG. 10 is a graph comparing currents between adjacent light emitting portions in the first to third experimental examples.

FIG. 7 is a cross-sectional view illustrating a light emitting display device according to a first experimental example. FIG. 8 is a cross-sectional view illustrating a light emitting display device according to a second experimental example. FIG. 9 is a cross-sectional view illustrating a light emitting display device according to a third experimental example. FIG. 10 is a graph comparing currents between adjacent light emitting portions in the first to third experimental examples.

As illustrated in FIG. 7, the light emitting display device according to the first experimental example Ex1 includes each of a blue light emitting portion, a green light emitting portion, and a red light emitting portion in a two-stack structure between an anode and a cathode facing each other. Further, the light emitting display device according to the first experimental example Ex1 has a structure different from that of FIG. 3 according to an embodiment of the present disclosure in that the optical compensation layer is not provided, and auxiliary hole transport layers G'HTL and R'HTL are provided on a second hole transport layer HTL2 of a second stack. The blue light emitting portion does not have the auxiliary hole transport layers G'HTL and R'HTL, and each of the green light emitting portion and the red light emitting portion has the auxiliary hole transport layers G'HTL and R'HTL. The auxiliary hole transport layers G'HTL and R'HTL may be formed of a material included in the hole transport layer.

In the first experimental example Ex1, a thickness of the auxiliary hole transport layer G'HTL of the green light emitting portion was set to 190 Å, and a thickness of the auxiliary hole transport layers R'HTL of the red light emitting portion was set to 680 Å.

As illustrated in FIG. 8, the light emitting display device according to the second experimental example Ex2 is different from the light emitting display device according to the first experimental example Ex1 in that each of optical compensation layers G'OCL and R'OCL is further provided on a lower surface of the n-type charge generation layer n-CGL.

In the second experimental example Ex2, a thickness of the auxiliary hole transport layer G'HTL of the green light emitting portion was set to 95 Å, a thickness of the optical compensation layer G'OCL was set to 95 Å, a thickness of the auxiliary hole transport layers R'HTL of the red light emitting portion was set to 340 Å, and a thickness of the optical compensation layer R'OCL was set to 340 Å.

As illustrated in FIG. 9, the light emitting display device according to the third experimental example Ex3 has the same structure as that of FIG. 3, and further has each of optical compensation layers G'OCL and R'OCL on a lower surface of the n-type charge generation layer n-CGL.

In the third experimental example Ex3, a thickness of the optical compensation layer G'OCL of the green light emitting portion was set to 190 Å, and a thickness of the optical compensation layer R'OCL of the red light emitting portion was set to 680 Å.

TABLE 1

| Experimental example | Adjacent light emitting portion current [mA/cm$^2$] * $10^{-5}$ B to R | B to G | Structure |
|---|---|---|---|
| Ex1 | 9.35 | 5.38 | 'HTL provided |
| Ex2 | 2.37 | 4.15 | 'HTL + 'OCL provided |
| Ex3 | 1.90 | 3.16 | 'OCL provided |

As illustrated in Table 1 and FIG. 10, as a result of selectively applying a voltage of 2.5 V to the blue light emitting portion and then measuring leakage current between adjacent light emitting portions for each of the first to third experimental examples Ex1 to Ex3, both leakage current from the blue light emitting portion to the red light emitting portion (B to R) and leakage current from the blue light emitting portion to the green light emitting portion (B to G) are greatest in the first experimental example Ex1 and smallest in the third experimental example Ex3. This means that, when compared to providing the auxiliary hole transport layer having an optical compensation function on the upper surface of the charge generation layer, lateral leakage current is blocked most effectively when the optical compensation layer is provided on the lower surface of the charge generation layer.

In addition, it can be seen that the leakage current from the blue light emitting portion to the red light emitting portion (B to R) is more effectively reduced than the leakage current from the blue light emitting portion to the green light emitting portion (B to G). This result is obtained by setting the thickness of the optical compensation layer R'OCL of the red light emitting portion to be greater than that of the optical compensation layer G'OCL of the green light emitting layer. That is, this means that the presence or absence of the optical compensation layer reduces the step to effectively block lateral leakage current, and the effect of blocking lateral leakage current increases as the number of optical compensation layers increases.

Each of both the light emitting display device according to the second experimental example Ex2 of FIG. 8 and the light emitting display device according to the third experimental example Ex3 of FIG. 9 has the optical compensation layer on the lower surface of the n-type charge generation layer, which corresponds to the light emitting display device according to the embodiment of the present disclosure.

Hereinafter, a light emitting display device according to another embodiment will be examined.

The light emitting display device of the present disclosure may be applied to a structure of a plurality of stacks, in particular, e stacks in which a plurality of charge generation layers is provided.

FIGS. 11 to 14 are cross-sectional views illustrating light emitting display devices according to other embodiments of the present disclosure.

Figure 11:
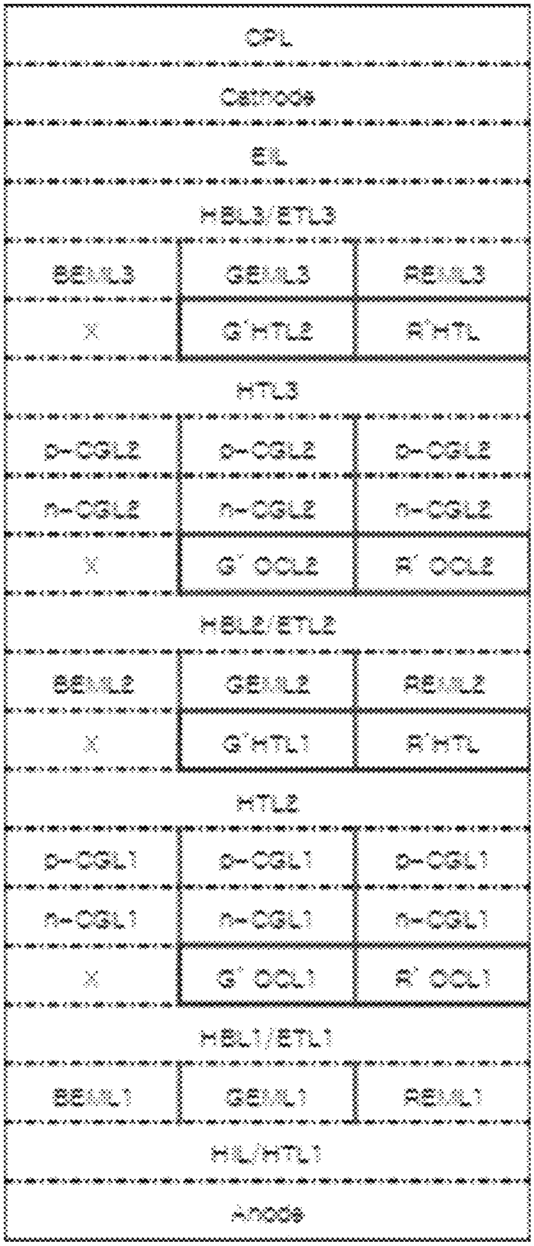
FIGS. 11 to 14 are cross-sectional views illustrating light emitting display devices according to other embodiments of the present disclosure.

As illustrated in FIG. 11, a light emitting display device according to an embodiment of the present disclosure has three stacks between an anode and a cathode.

A first stack includes a hole transport-related layer HTL/HTL1, first light emitting layers BEML1, GEML1, and REML1, and a first electron transport-related layer HBL1/ETL1, and selectively includes first stacked optical compensation layers G'OCL1 and R'OCL1 in the green light emitting portion and the red light emitting portion.

A first charge generation layer includes a first n-type charge generation layer n-CGL1 and a first p-type charge generation layer p-CGL1.

Here, a lower surface of the first n-type charge generation layer n-CGL1 is in contact with the first electron transport layer ETL1 in the blue light emitting portion and is in contact with the optical compensation layers G'OCL1 and R'OCL1 in the green light emitting portion and the red light emitting portion, respectively. In this way, due to a stepped portion between a formation area and a non-formation area of the optical compensation layers G'OCL1 and R'OCL1, a part where the charge generation layers n-CGL1 and p-CGL1 are disconnected is generated or paths of the charge generation layers n-CGL1 and p-CGL1 are lengthened in a region between light emitting portions, so that lateral leakage current may be prevented or blocked.

Further, a second stack includes a second hole transport-related layer HTL2, second light emitting layers BEML2, GEML2, and REML2, and a second electron transport-related layer HBL2/ETL2. In addition, in the green light emitting portion and the red light emitting portion, first auxiliary hole transport layers G'HTL1 and R'HTL1 are selectively provided between the second light emitting layers GEML2 and RMEL2 and the second hole transport-related layer HTL2, and second stacked optical compensation layers G'OCL1 and R'OCL1 are selectively provided between the second electron transport layer ETL2 and a second n-type charge generation layer n-CGL2, respectively.

In this case, the first auxiliary hole transport layers G'HTL1 and R'HTL1 and the second stacked optical compensation layers G'OCL1 and R'OCL1 selectively provided in the green light emitting portion and the red light emitting portion, respectively, may affect a step, a thickness, and a formation path of the second n-type charge generation layer n-CGL2 to reduce or block a side leakage path between adjacent light emitting portions.

A second charge generation layer includes a second n-type charge generation layer n-CGL2 and a second p-type charge generation layer p-CGL2.

In addition, a third stack includes a third hole transport-related layer HTL3, third light emitting layers BEML3, GEML3, and REML3, and a third electron transport-related layer HBL3/ETL3. In addition, in the green light emitting portion and the red light emitting portion, second auxiliary hole transport layers G'HTL2 and R'HTL2 may be selectively provided between the third light emitting layers GEML3 and RMEL3 and the third hole transport-related layer HTL3, respectively.

In this case, the second auxiliary hole transport layers G'HTL2 and R'HTL2 may adjust an optimal resonance distance between the third light emitting layers BEML3, GEML3, and REML3 emitting light from the third stack.

Figure 12:
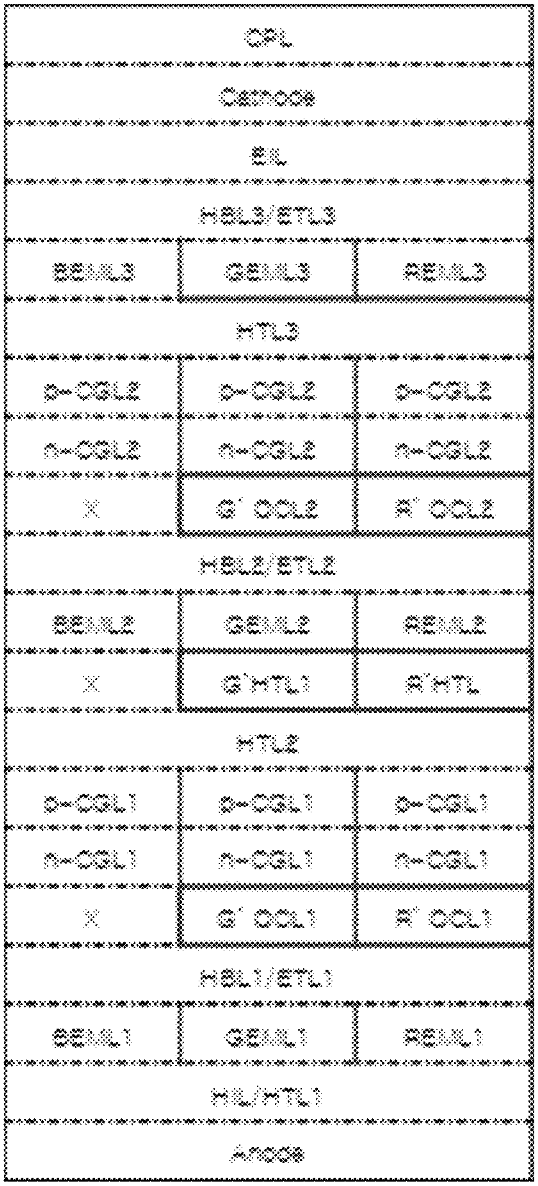

When compared to FIG. 11, the light emitting display device according to FIG. 12 does not include an optical compensation layer or an auxiliary hole transport layer at the top where the second p-type charge generation layer p-CGL2 is formed. In this case, the second n-type charge generation layer n-CGL2 may adjust a path and a thickness of the second charge generation layer n-CGL2/p-CGL2 between adjacent light emitting portions by including the second stacked optical compensation layers G'OCL2 and R'OCL2 at the bottom, and thus may prevent or block lateral leakage current.

Figure 13:
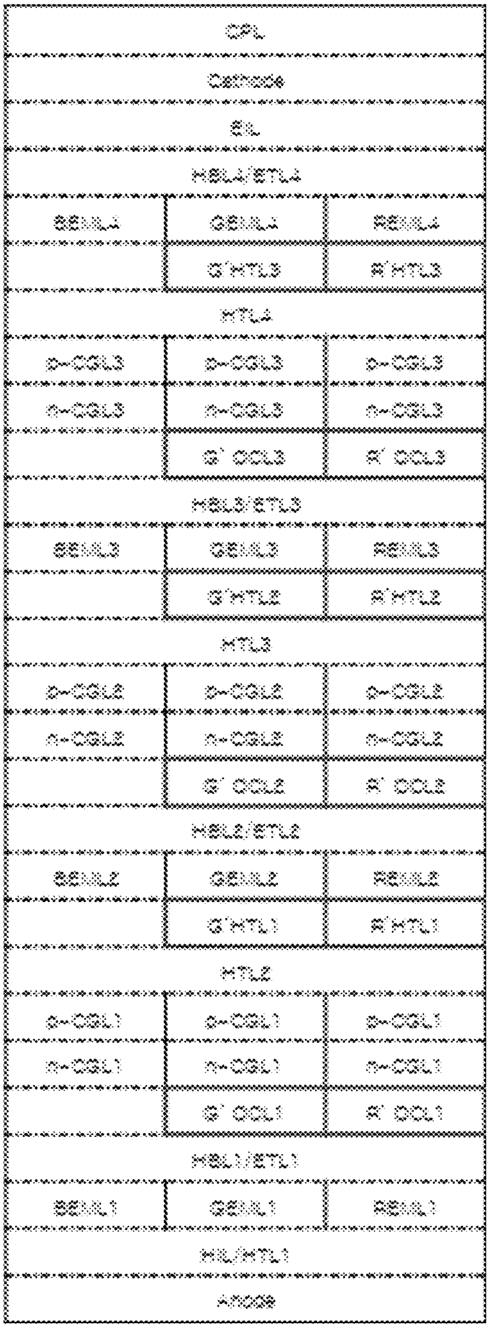

When compared to the light emitting display device of FIG. 11, the light emitting display device according to FIG. 13 further includes third stacked optical compensation layers G'OCL and R'OCL, a third charge generation layer n-CGL3/p-CGL3, and a fourth stack.

The fourth stack includes a fourth hole transport-related layer HTL4, fourth light emitting layers BEML4, GEML4, and REML4, and a fourth electron transport-related layer HBL4/ETL4. In addition, in the green light emitting portion and the red light emitting portion, third auxiliary hole transport layers G'HTL3 and R'HTL3 may be selectively provided between the fourth light emitting layers GEML4 and RMEL4 and the fourth hole transport-related layer HTL4, respectively.

In this case, the third auxiliary hole transport layers G'HTL3 and R'HTL3 may adjust an optimal resonance distance between the fourth light emitting layers BEML4, GEML4, and REML4 emitting light in the fourth stack.

Figure 14:
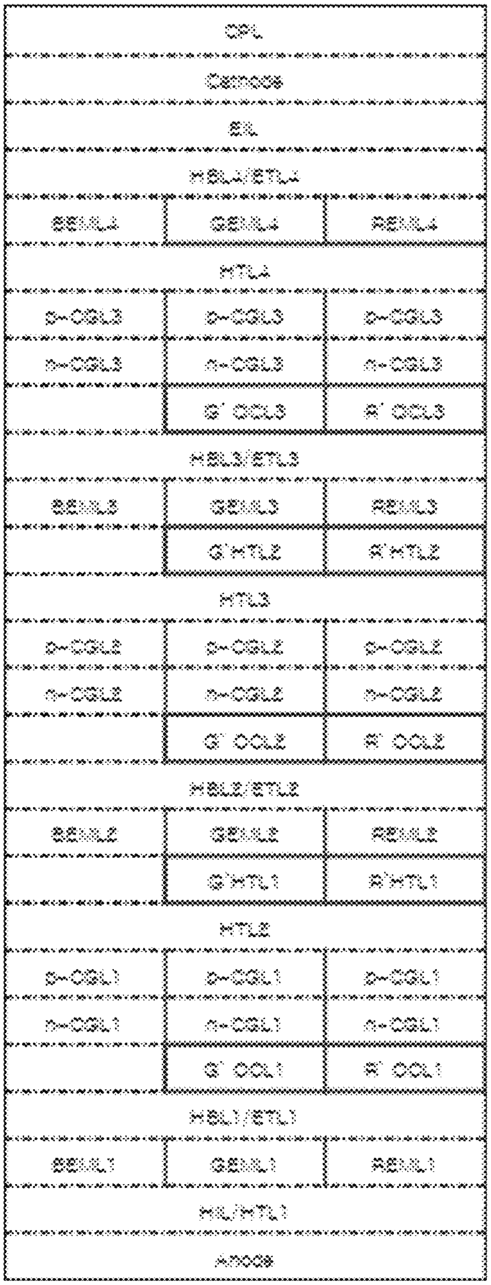

When compared to FIG. 13, the light emitting display device according to FIG. 14 does not include an optical compensation layer or an auxiliary hole transport layer at a top where the third p-type charge generation layer p-CGL3 is formed. In this case, the third n-type charge generation layer n-CGL3 may adjust a path and a thickness of the third charge generation layer n-CGL3/p-CGL3 between adjacent light emitting portions by including the third stacked optical compensation layers G'OCL3 and R'OCL3 at the bottom, and thus may prevent or block lateral leakage current.

Even though the 3-stack structure and the 4-stack structure of the light emitting element have been described in FIGS. 11 to 14, the light emitting display device of the present disclosure is not limited thereto. When an optical compensation layer is provided on any one light emitting portion on the lower surface of the charge generation layer, and the path and thickness of the charge generation layer may be controlled by the optical compensation layer, the light emitting display device may correspond to a light emitting display device according to an embodiment of the present disclosure.

The light emitting display device of the present disclosure includes the optical compensation layer on the lower surface of the charge generation layer, and may prevent lateral leakage current by creating separation between adjacent light emitting portions in the charge generation layer by a surface step between a region where the optical compensation layer is formed and a region where the optical compensation layer is not formed or lengthening the path between adjacent light emitting portions.

In addition, the optical compensation layer may be different in thickness for each color emitted by the light emitting portion, thereby differentiating a resonant distance between the first electrode and the second electrode by the optical compensation layer provided for each light emitting portion, and compensating optical characteristics for each color.

Further, in the light emitting display device of the present disclosure, the optical compensation layer may adjust the vertical distance between the first and second electrodes required for each light emitting color without increasing the distance between the first and second electrodes or using a separate material, and solve the lateral leakage current, so that the lateral leakage current may be solved while maintaining low power of the light emitting element.

The optical compensation layer in contact with the charge generation layer is made of the material of the electron transport layer, and a supply chamber of the electron transport layer may be used for formation of the optical compensation layer. In addition, the optical compensation layer is formed in a region at the same level as the area of the light emitting portion, and may be formed using a deposition mask used in forming the light emitting layer. Therefore, it is possible to manufacture a light emitting display device capable of preventing lateral leakage current without changing equipment, and thus has an ESG (Environmental/Social/Governance) effect in terms of eco-friendliness, low power consumption, and process optimization.

A light emitting display device according to one or more aspects of the present disclosure may comprise a bank to expose a plurality of light emitting portions spaced apart from each other on a substrate, a first electrode at each of the plurality of light emitting portions and a second electrode to face the first electrode, the second electrode over the plurality of light emitting portions, a first stack, a second stack, and a charge generation layer between the first stack and the second stack, wherein the first stack, the second stack, and the charge generation are positioned between the first electrode and the second electrode and an optical compensation layer located between the charge generation layer and the first stack at at least one of the plurality of light emitting portions and in contact with the charge generation layer.

In a light emitting display device according to one or more aspects of the present disclosure, the optical compensation layer may have an edge on a bank adjacent to the at least one light emitting portion.

In a light emitting display device according to one or more aspects of the present disclosure, the optical compensation layer may be thicker than the charge generation layer.

In a light emitting display device according to one or more aspects of the present disclosure, the optical compensation layer may comprise an electron transport material.

In a light emitting display device according to one or more aspects of the present disclosure, the charge generation layer may include an N-type charge generation layer and a P-type charge generation layer. The N-type charge generation layer may be in contact with the optical compensation layer.

In a light emitting display device according to one or more aspects of the present disclosure, a thickness of the charge generation layer may be smaller on the optical compensation layer above the bank than on the optical compensation layer at the at least one of the plurality of light emitting portions.

In a light emitting display device according to one or more aspects of the present disclosure, an optical compensation layer non-formation area may be provided on the bank adjacent to the edge of the optical compensation layer. The charge generation layer may be in contact with an electron transport layer of the first stack at the optical compensation layer non-formation area.

In a light emitting display device according to one or more aspects of the present disclosure, the plurality of light emitting portions may include a first light emitting portion, a second light emitting portion, and a third light emitting portion. The first light emitting portion may include a first blue light emitting layer and a second blue light emitting layer in the first stack and the second stack, respectively. The second light emitting portion may include a first green light emitting layer and a second green light emitting layer in the first stack and the second stack, respectively. The third light emitting portion may include a first red light emitting layer and a second red light emitting layer in the first stack and the second stack, respectively. The optical compensation layer may include a first optical compensation layer in the second light emitting portion and a second optical compensation layer in the third light emitting portion.

In a light emitting display device according to one or more aspects of the present disclosure, an optical compensation layer may be absent at the first light emitting portion. The charge generation layer on the bank, may come into contact with an electron transport layer of the first stack at a region adjacent to the first light emitting portion and may come into contact with the first optical compensation layer or the second optical compensation layer as a distance from the first light emitting portion increases.

In a light emitting display device according to one or more aspects of the present disclosure, the second optical compensation layer may be thicker than the first optical compensation layer.

A light emitting display device according to one or more aspects of the present disclosure may further comprise an additional stack and an additional charge generation layer between the second stack and the second electrode.

In a light emitting display device according to one or more aspects of the present disclosure, the additional charge generation layer may be in contact with an additional optical compensation layer overlapping the optical compensation layer.

A light emitting display device according to one or more aspects of the present disclosure may comprise a bank to expose a first light emitting portion, a second light emitting portion, and a third light emitting portion spaced apart from each other on a substrate, a first light emitting element at the first light emitting portion to emit blue light, a second light emitting element at the second light emitting portion to emit green light and a third light emitting element at the third light emitting portion to emit red light. A lower surface of a charge generation layer commonly provided in the first to third light emitting portions may be in contact with an electron transport layer at the first light emitting portion, in contact with a first optical compensation layer at the second light emitting portion, and in contact with a second optical compensation layer at the third light emitting portion.

In a light emitting display device according to one or more aspects of the present disclosure, the second optical compensation layer may be thicker than the first optical compensation layer.

In a light emitting display device according to one or more aspects of the present disclosure, each of the first optical compensation layer and the second optical compensation layer may be thicker than the charge generation layer.

In a light emitting display device according to one or more aspects of the present disclosure the first light emitting element may include a first blue light emitting layer below the electron transport layer and a second blue light emitting layer above the charge generation layer, the second light emitting element may include a first green light emitting layer below the electron transport layer and a second green light emitting layer above the charge generation layer, and the third light emitting element may include a first red light emitting layer below the electron transport layer and a second red light emitting layer above the charge generation layer. A first vertical distance between the first blue light emitting layer and the charge generation layer may be smaller than each of a second vertical distance between the first green light emitting layer and the charge generation layer and a third vertical distance between the first red light emitting layer and the charge generation layer.

In a light emitting display device according to one or more aspects of the present disclosure, the first optical compensation layer and the second optical compensation layer may have a first edge and a second edge, respectively, each of the first edge and the second edge is located on a bank around the first light emitting portion. An optical compensation layer non-formation area adjacent to the first edge and the second edge may be provided on the bank. The charge generation layer may be in contact with the electron transport layer at the optical compensation layer non-formation area.

In a light emitting display device according to one or more aspects of the present disclosure, the charge generation layer may be provided along surface steps of the first edge and the second edge.

In a light emitting display device according to one or more aspects of the present disclosure, the first optical compensation layer and the second optical compensation layer may comprise an electron transport material.

In a light emitting display device according to one or more aspects of the present disclosure, the charge generation layer may include an N-type charge generation layer and a P-type charge generation layer. The N-type charge generation layer may be in contact with the first optical compensation layer and the second optical compensation layer.

The light emitting display device of the present disclosure has the following effects.

First, the optical compensation layer is provided on the lower surface of the charge generation layer, and lateral leakage current may be prevented by creating separation between adjacent light emitting portions in the charge generation layer by a surface step between a region where the optical compensation layer is formed and a region where the optical compensation layer is not formed or lengthening the path between adjacent light emitting portions.

Second, the optical compensation layer may be different in thickness for each color emitted by the light emitting portion, thereby differentiating a resonant distance between the first electrode and the second electrode by the optical compensation layer provided for each light emitting portion, and compensating optical characteristics for each color.

Third, in the light emitting display device of the present disclosure, the optical compensation layer may adjust the vertical distance between the first and second electrodes required for each light emitting color without increasing the distance between the first and second electrodes or using a separate material, and solve the lateral leakage current, so that the lateral leakage current may be solved while maintaining low power consumption of the light emitting element.

Fourth, the optical compensation layer in contact with the charge generation layer may comprise electron transport material, and a supply chamber of an electron transport layer may be used for formation of the optical compensation layer. In addition, the optical compensation layer may be formed at a region at the same level as the area of the light emitting portion, and may be formed using a deposition mask used in forming the light emitting layer. Therefore, it is possible to manufacture a light emitting display device capable of preventing lateral leakage current without changing equipment or adding a manufacturing device.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting display device comprising:

a bank to expose a plurality of light emitting portions spaced apart from each other on a substrate;

a first electrode at each of the plurality of light emitting portions and a second electrode to face the first electrode, the second electrode over the plurality of light emitting portions;

a first stack, a second stack, and a charge generation layer between the first electrode and the second electrode; and an optical compensation layer located between the charge generation layer and the first stack at least one of the plurality of light emitting portions and in contact with the charge generation layer.

2. The light emitting display device according to claim 1, wherein the optical compensation layer has an edge on a bank adjacent to the at least one of the plurality of light emitting portions.

3. The light emitting display device according to claim 1, wherein the optical compensation layer is thicker than the charge generation layer.

4. The light emitting display device according to claim 1, wherein the optical compensation layer comprises an electron transport material.

5. The light emitting display device according to claim 1, wherein:

the charge generation layer includes an N-type charge generation layer and a P-type charge generation layer; and the N-type charge generation layer is in contact with the optical compensation layer.

6. The light emitting display device according to claim 1, wherein a thickness of the charge generation layer is smaller on the optical compensation layer above the bank than on the optical compensation layer at the at least one of the plurality of light emitting portions.

7. The light emitting display device according to claim 2, wherein:

an optical compensation layer non-formation area is provided on the bank adjacent to the edge of the optical compensation layer; and the charge generation layer is in contact with an electron transport layer of the first stack at the optical compensation layer non-formation area.

8. The light emitting display device according to claim 1, wherein:

the plurality of light emitting portions includes a first light emitting portion, a second light emitting portion, and a third light emitting portion;

the first light emitting portion includes a first blue light emitting layer and a second blue light emitting layer in the first stack and the second stack, respectively;

the second light emitting portion includes a first green light emitting layer and a second green light emitting layer in the first stack and the second stack, respectively;

the third light emitting portion includes a first red light emitting layer and a second red light emitting layer in the first stack and the second stack, respectively; and the optical compensation layer includes a first optical compensation layer in the second light emitting portion and a second optical compensation layer in the third light emitting portion.

9. The light emitting display device according to claim 8, wherein:

the first light emitting portion does not have an optical compensation layer, and the charge generation layer on the bank, comes into contact with an electron transport layer of the first stack at a region adjacent to the first light emitting portion and comes into contact with the first optical compensation layer or the second optical compensation layer as a distance from the first light emitting portion increases.

10. The light emitting display device according to claim 8, wherein the second optical compensation layer is thicker than the first optical compensation layer.

11. The light emitting display device according to claim 1, further comprising an additional stack and an additional charge generation layer between the second stack and the second electrode.

12. The light emitting display device according to claim 11, wherein the additional charge generation layer is in contact with an additional optical compensation layer overlapping the optical compensation layer.

13. A light emitting display device comprising:

a bank to expose a first light emitting portion, a second light emitting portion, and a third light emitting portion spaced apart from each other on a substrate;

a first light emitting element at the first light emitting portion to emit blue light;

a second light emitting element at the second light emitting portion to emit green light; and a third light emitting element at the third light emitting portion to emit red light, wherein a lower surface of a charge generation layer commonly provided in the first light emitting portion, the second light emitting portion, and the third light emitting portion is in contact with an electron transport layer at the first light emitting portion, in contact with a first optical compensation layer at the second light emitting portion, and in contact with a second optical compensation layer at the third light emitting portion.

14. The light emitting display device according to claim 13, wherein the second optical compensation layer is thicker than the first optical compensation layer.

15. The light emitting display device according to claim 13, wherein each of the first optical compensation layer and the second optical compensation layer is thicker than the charge generation layer.

16. The light emitting display device according to claim 13, wherein:

the first light emitting element includes a first blue light emitting layer below the electron transport layer and a second blue light emitting layer above the charge generation layer;

the second light emitting element includes a first green light emitting layer below the electron transport layer and a second green light emitting layer above the charge generation layer;

the third light emitting element includes a first red light emitting layer below the electron transport layer and a second red light emitting layer above the charge generation layer; and a first vertical distance between the first blue light emitting layer and the charge generation layer is smaller than each of a second vertical distance between the first green light emitting layer and the charge generation layer and a third vertical distance between the first red light emitting layer and the charge generation layer.

17. The light emitting display device according to claim 16, wherein:

the first optical compensation layer and the second optical compensation layer have a first edge and a second edge, respectively, each on a bank around the first light emitting portion; and an optical compensation layer non-formation area adjacent to the first edge and the second edge is provided on the bank, and the charge generation layer is in contact with the electron transport layer at the optical compensation layer non-formation area.

18. The light emitting display device according to claim 17, wherein the charge generation layer is provided along surface steps of the first edge and the second edge.

19. The light emitting display device according to claim 13, wherein the first optical compensation layer and the second optical compensation layer comprise an electron transport material.

20. The light emitting display device according to claim 13, wherein:

the charge generation layer includes an N-type charge generation layer and a P-type charge generation layer; and the N-type charge generation layer is in contact with the first optical compensation layer and the second optical compensation layer.

* * * * *